United States Patent
Shamir et al.

(10) Patent No.: US 10,401,401 B2
(45) Date of Patent: Sep. 3, 2019

(54) SYSTEM AND METHODS THEREOF FOR MONITORING OF ENERGY CONSUMPTION CYCLES

(71) Applicant: Panoramic Power Ltd., Kfar Saba (IL)

(72) Inventors: Adi Shamir, Kidron (IL); Itay Reved, Kiryat Ono (IL); Reuven A. Marko, Netanya (IL)

(73) Assignee: Panoramic Power Ltd., Kfar-Saba (IL)

( * ) Notice: Subject to any disclaimer, the term of this patent is extended or adjusted under 35 U.S.C. 154(b) by 439 days.

(21) Appl. No.: 14/662,039

(22) Filed: Mar. 18, 2015

(65) Prior Publication Data
US 2015/0276829 A1 Oct. 1, 2015

Related U.S. Application Data

(60) Provisional application No. 61/972,759, filed on Mar. 31, 2014.

(51) Int. Cl.
G01R 27/26 (2006.01)
G05F 1/66 (2006.01)
G01R 21/133 (2006.01)

(52) U.S. Cl.
CPC .................. *G01R 21/133* (2013.01)

(58) Field of Classification Search
CPC .................................. G01R 21/1331
USPC .......................................... 702/62
See application file for complete search history.

(56) References Cited

U.S. PATENT DOCUMENTS

| | | |
|---|---|---|
| 5,196,982 A | 3/1993 | Landsberg et al. |
| 6,983,210 B2 | 1/2006 | Matsubayashi et al. |
| 6,993,417 B2 | 1/2006 | Osann, Jr. |
| 7,276,915 B1 | 10/2007 | Euler et al. |
| 7,317,404 B2 | 1/2008 | Cumeralto et al. |
| 7,346,433 B2 | 3/2008 | Budike, Jr. |
| 7,423,546 B1 | 9/2008 | Aisa |
| 7,451,017 B2 | 11/2008 | McNally |
| 7,460,930 B1 | 12/2008 | Howell et al. |
| 7,463,986 B2 | 12/2008 | Hayes |
| 7,605,698 B2 | 10/2009 | Moriwaki |
| 7,840,383 B2 | 11/2010 | Wang |
| 8,255,090 B2 | 8/2012 | Frader-Thompson et al. |
| 8,368,386 B2 | 2/2013 | Reineccius |
| 8,468,380 B2 | 6/2013 | Munjal et al. |
| 8,644,166 B2 | 2/2014 | Xia et al. |
| 8,649,987 B2 | 2/2014 | Steenberg et al. |
| 8,665,061 B2 | 3/2014 | Kagan et al. |

(Continued)

*Primary Examiner* — Moazzam Hossain
*Assistant Examiner* — Omar F Mojaddedi
(74) *Attorney, Agent, or Firm* — M&B IP Analysts, LLC

(57) ABSTRACT

A system comprises of a plurality of current consumption monitors, such as self-powered power sensors (SPPSs) that collect information from energy consuming equipment. The monitors check periodically the current consumed by the equipment and the results are stored in memory. Periodically the data collected is processed respective of each monitor to determine the ratio between the total number of cycles, i.e., the number of times an equipment consumed energy, to the number of cycles in which the equipment consumed energy for a period of time that is shorter than a predetermined threshold of time. Upon detection of a change in the ratio over a period of time an alert is provided. In one embodiment the equipment may be caused to shut down responsive of an appropriate alert.

29 Claims, 5 Drawing Sheets

(56) References Cited

U.S. PATENT DOCUMENTS

| | | |
|---|---|---|
| 8,712,732 B2 | 4/2014 | Patel et al. |
| 8,805,628 B2 | 8/2014 | Patel et al. |
| 2010/0076615 A1* | 3/2010 | Daniel ................... F03D 9/00 700/293 |
| 2010/0156666 A1* | 6/2010 | Choi ....................... H04B 3/54 340/870.07 |
| 2011/0251807 A1* | 10/2011 | Rada ....................... G01D 4/00 702/61 |
| 2012/0062249 A1* | 3/2012 | Shamir ............... G01R 15/186 324/679 |
| 2012/0072143 A1 | 3/2012 | Yogeeswaran et al. |
| 2012/0271576 A1* | 10/2012 | Kamel ............... H02J 13/0006 702/62 |
| 2013/0119972 A1 | 5/2013 | Maguire et al. |
| 2014/0277813 A1* | 9/2014 | Powell ................. H02J 3/1821 700/298 |
| 2014/0347039 A1 | 11/2014 | Patel et al. |
| 2014/0371936 A1* | 12/2014 | Kamel ............... G01R 21/1333 700/291 |

\* cited by examiner

SYSTEM AND METHODS THEREOF FOR MONITORING OF ENERGY CONSUMPTION CYCLES

CROSS-REFERENCE TO RELATED APPLICATIONS

This application claims the benefit of U.S. Provisional Patent Application No. 61/972,759 filed Mar. 31, 2014.

BACKGROUND OF THE INVENTION

1. Field of the Invention

The invention generally relates to energy management systems, and more specifically to the monitoring of energy consumption by temperature controlled equipment having operational cycles.

2. Prior Art

Many electrical devices cycle periodically between operation, i.e., on mode, and non-operation, i.e., off mode, states. This operating scheme is typical, for example, to temperature controlled equipment such as compressors that are used for refrigeration or heating, ventilation and air-conditioning (HVAC) equipment. By analyzing these cycles, it is possible to detect or predict equipment failures, and by that achieve significant savings in energy and capital.

A typical and very simple example is equipment that stops from cycling and is in a continuous 'on' state (continuously active). In compressors comprised within HVAC systems, for example, this can be sometimes a result of a broken contact in the temperature control circuit, too low temperature set point, if a unit that is under-sized relative to the cooling space and more. Another example is equipment that shows excessive cycling (too many cycles per day) or excessive short cycles (i.e., cycles in which the 'on' state lasts only a short period of time, e.g., a few minutes). Since most cooling systems take several minutes to reach at steady state after the compressor starts, compressor run times of less than ten minutes may indicate a problem in the system. This condition is typically caused by gross equipment oversizing, poor thermostat location, coil blockage, condenser fan problems or compressor problems and more.

The above cycle analysis requires circuit level real time monitoring that can be achieved by placing various monitors such as self-powered power sensors (SPPSs). It would be advantageous to use the data collected by such monitor devices for the purpose of energy savings as well as failure detection, preventative maintenance and prediction in cycling equipment.

BRIEF DESCRIPTION OF THE DRAWINGS

The subject matter that is regarded as the invention is particularly pointed out and distinctly claimed in the claims at the conclusion of the specification. The foregoing and other objects, features and advantages of the invention will be apparent from the following detailed description taken in conjunction with the accompanying drawings.

DETAILED DESCRIPTION OF THE PREFERRED EMBODIMENTS

Figure 1:
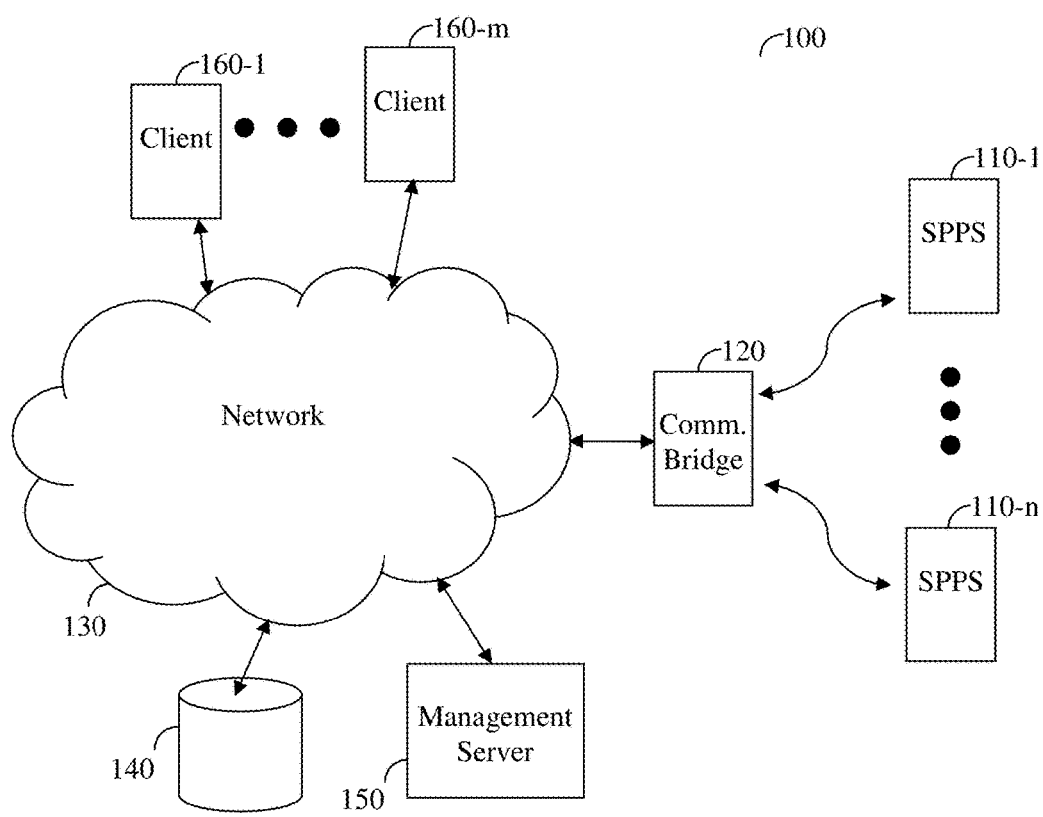
FIG. 1 is a system for monitoring energy consumption cycles according to an embodiment.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

A system comprises of a plurality of current consumption monitors, such as self-powered power sensors (SPPSs) that collect information from energy consuming equipment. The monitors check periodically the current consumed by the equipment and the results are stored in memory. Periodically the data collected is processed respective of each monitor to determine the ratio between the total number of cycles, i.e., the number of times an equipment consumed energy, to the number of cycles in which the equipment consumed energy for a period of time that is shorter than a predetermined threshold of time. Upon detection of a change in the ratio over a period of time an alert is provided. In one embodiment the equipment may be caused to shut down responsive of an appropriate alert.

FIG. 1 depicts an exemplary and non-limiting diagram of a system 100 for monitoring energy consumption cycles according to an embodiment. The system comprises a network 130 the enables communications between various portions of the system 100. The network may comprise the likes of busses, local area network (LAN), wide area network (WAN), metro area network (MAN), the worldwide web (WWW), the Internet, as well as a variety of other communication networks, whether wired or wireless, and in any combination, that enable the transfer of data between the different elements of the system 100. One or more current consumption monitors 110 (also referred to herein as monitors) are used to monitor the current consumed by energy consuming equipment. In one embodiment self-powered power sensors (SPPSs) are used, for example SPPS 110-1 to 110-$n$, where 'n' is an integer equal to or greater of '1'. In one embodiment the SPPSs 110 are communicatively coupled to the network 130 via a communication bridge 120. An exemplary but not limiting SPPS 110 is disclosed in co-pending U.S. patent application Ser. No. 12/760,867, filed Apr. 15, 2010, having the title of "Apparatus and Methods Thereof for Power Consumption Measurement at Circuit Breaker Points" as well as UK patents 2481778 and 2498884. To the network there is communicatively connected a management server 150, typically comprising at least a processing unit (not shown) and a memory (not shown), the memory containing instructions that are executed by the processing unit. According to an embodiment of the invention the instructions stored in the memory are those that configure the system 100 to perform the method described in greater detail with respect of FIG. 3. The memory may contain also data collected by the monitors 110, however, such data may also be stored in storage 140, where in certain embodiments the memory of the management server 150 stores into or retrieves therefrom data and/or instructions. The system 100 may further comprise one or more client nodes 160, for example, client node 160-1 through client node 160-*m*, where 'm' is an integer equal to or greater of '1'. A client node 160 may have a display for displaying results of data collection made by the monitors 110, data analyzed by the server 150, data stored in storage 140, or to receive alerts or period reports sent from the server 150. Alerts include but are not limited to emails, text messages, mobile notifications, and screen notifications.

Figure 2:
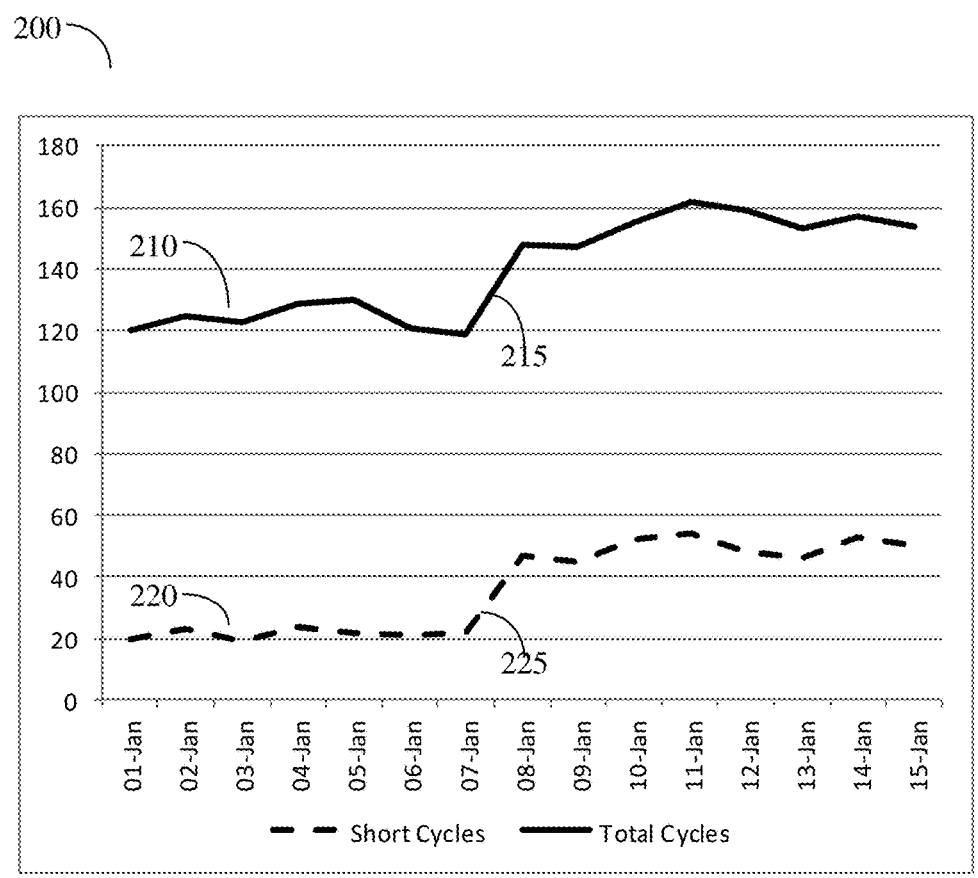
FIG. 2 is a chart of total cycles and short cycles of an energy consuming equipment.

Prior to a detailed description of the operation of the system 100, reference is made to FIG. 2 that depicts an exemplary and non-limiting chart 200 of total cycles 210 and short cycles 220 of an energy consuming equipment. Between January 1 and 7 the number of short cycles shown by line 220 are in the range of roughly 20-24 short cycles or so per day, versus roughly 120-130 total cycles per day, at a ratio around 0.17 or so. From January 8 and onwards there is a jump 225 in the number of short cycles, in the range of 45-55 short cycles per day, and also a jump 215 in the number of total cycles per day. The ratio now also increased to about 0.32. Such an increase is a reason for concern and may be a result of an equipment about to fail, equipment already in a failure mode, or another problem that requires fixing. It is therefore advantageous to provide an alarm, as close as possible to real time so that preventive action may take place. In some cases, it would be beneficial for the system to store past data for the purpose of being used to automatically determine threshold values, or, manually configure the server 150 to override an alert that is actually a false alarm.

According to an embodiment, the SPPSs 110 monitor the real time current consumed by individual energy consuming equipment, which may be single or three-phase devices. Data respective of current consumption is sent through the communication bridge 120 to the server 150 periodically, preferably at least at one minute intervals. In one embodiment an SPPS 110 may also send exact on/off indications whenever current starts/ends as such SPPS 110 may provide in addition to current consumption information also a time stamp for each measurement. In one embodiment the time stamp may be added by the communication bridge 120. In another embodiment the server 150 will attach the time stamp to the measurement received. A 'cycle' is defined as a pulse of current, that contains a transition between some baseline current to some current greater than the baseline ('on') for a period of time in which current is greater than the baseline ('cycle length'), and a transition back to baseline current ('off'). The above baseline current can be zero, or another predetermined minimum current value, if only the compressor is monitored, but can be greater than zero if a whole unit that includes some energy consuming circuits such as fans and electronic circuits. A current threshold is defined in the server 150, which indicates transition between 'on' and 'off' states. This threshold can be defined in several ways: manually, by a user for each piece of equipment or equipment type, using, for example, a client node 160; automatically by the server 150 using a pattern recognition algorithm after running the system 100 for a training period and collecting relevant data; using benchmarks obtained automatically from external resources (not shown) connected to or accessible via the network 130; analyzing data of similar equipment on site and worldwide; and any combination thereof.

A non-limiting method for determination of the current threshold is checking at the 50% point between the minimum current and maximum current, averaged over a period of time. Typically, in standard compressors, a minimum current is zero amperes and a maximum current is the operating current of the compressor. The state (on/off) of the compressor being measured is then be determined, and a binary vector can is obtained with respect of the on state of the device. The time interval of the on state is then measured and the number of cycles counted. Short cycles and long cycles are categorized by the time thresholds described hereinabove. In another embodiment, two compressors may be monitored by the same monitor. This is typical situation for roof top units (RTUs) that comprise two identical compressors. In such cases, where more than a single compressor is used with respect of a single monitor, a more complex algorithm should be applied to detect the number of cycles per compressor without departing from the scope of the invention, for example by using two current thresholds.

Figure 3A:
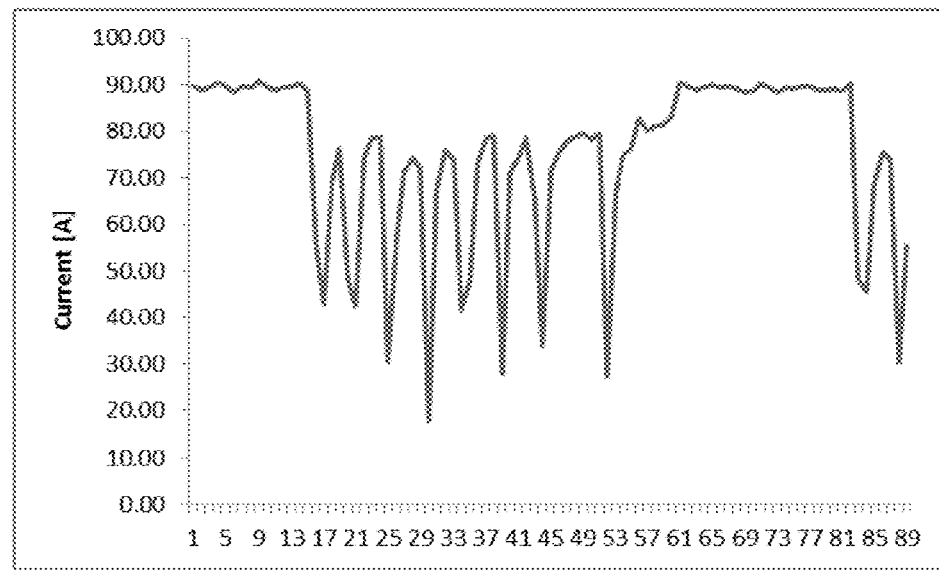
FIGS. 3A and 3B are timing diagrams showing the currents measured and respective on cycles determined.
Figure 3B:
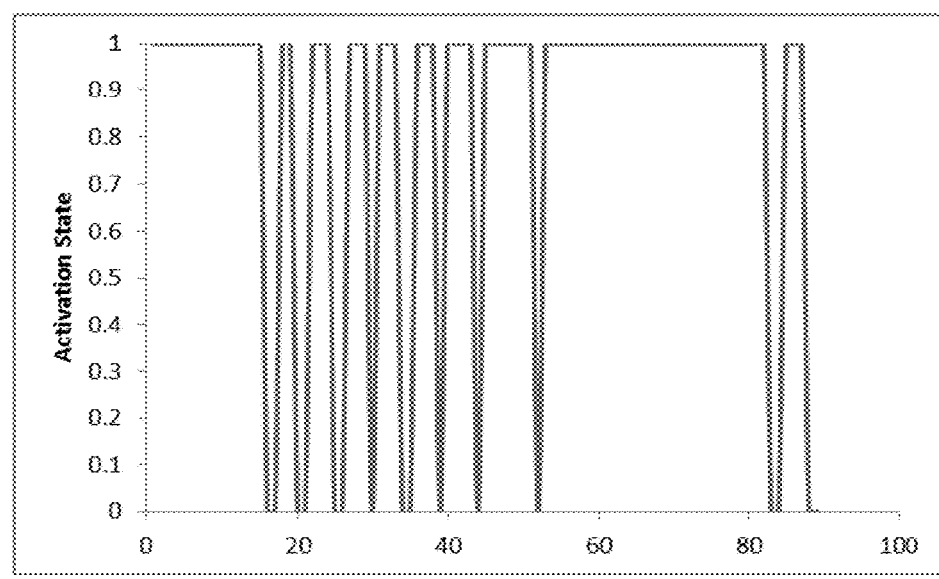

FIGS. 3A and 3B depict exemplary and non-limiting timing diagrams showing the currents measured and respective cycles determined. FIG. 3A shows a current consumption profile of 90 minutes of a compressor varying between 0 and 90 A in a one minute resolution. FIG. 3B depicts the cycles derived from that current consumption profile. This is a binary state chart of 1's and 0's, where a '1' means an operating state (i.e., an on condition) and '0' means not operating state (i.e., an off condition). The chart of FIG. 3B was generated using a 60 A threshold current, and determining the 'on' condition by a crossing of the threshold current from a low current to a current above the threshold, and the 'off' condition by a crossing of the threshold current from a current above the threshold current to a current that is below the threshold current. In an exemplary and non-limiting case where a short cycle is determined to be of a duration that is less than 10 minutes, there are identifies 8 short cycles out of 10 cycles in total during the 90 minute period, and hence a ratio of 80%. Typically, this could be an indication of a potential failure due to the high ratio of short cycles within a short period of time. An alert may be sent, according to the principles of the invention, to draw the attention of an operator to this potentially problematic condition.

The server 150 is configured with instructions in its memory that can perform the desired analytics by using the current threshold and extracts the cycle information from the current data to a simplified data stream which may include: number of cycles per unit time (cycles/hour, cycles/day, cycles/month); number of 'short' cycles per unit time (defined as cycles with length not greater than X minutes), and, duty cycle histograms. The data gathered can therefore be used to detect potential failure or maintenance alerts for cases having similar energy consumption profiles. A user of system 100 can get indications of failures or maintenance needs via presenting the cycle data in online charts, scheduled reports or real time alerts that are sent to the client nodes 160. Non-limiting examples for such indications are: number of short cycles per period of time, for example, per day, per hour, etc., exceeds a predetermined threshold which indicates of a potential set point problem which may result in shortage of oil flow, leading to equipment failure; for example more than four compressor starts per hour can reduce a compressor's life expectancy and reduce cooling system efficiency by up to 10%; equipment stopped cycling (number of cycles is zero for above a predetermined period of time) which may result in a conclusion of a potential power problem; total number of cycles from start, per month, per week, or any other defined period of time, exceeds a predetermined threshold value, which may predict a decrease in the life expectancy span of the equipment; and, equipment that is constantly on leading to a conclusion of a potential issue with set point or a control circuit, ratio of short cycles to total cycles on a daily basis higher than a threshold can indicate for example that the unit is oversized. Any of the threshold described herein may be set: manually by the user using a client node 160 for each piece of equipment or equipment type; automatically by the server 160 after running the system 100 for a training period to determine the normal behavior of the system 100; or, using benchmarks obtained automatically by the server 160, and analyzing data collected for similar equipment on site and worldwide.

Figure 4:
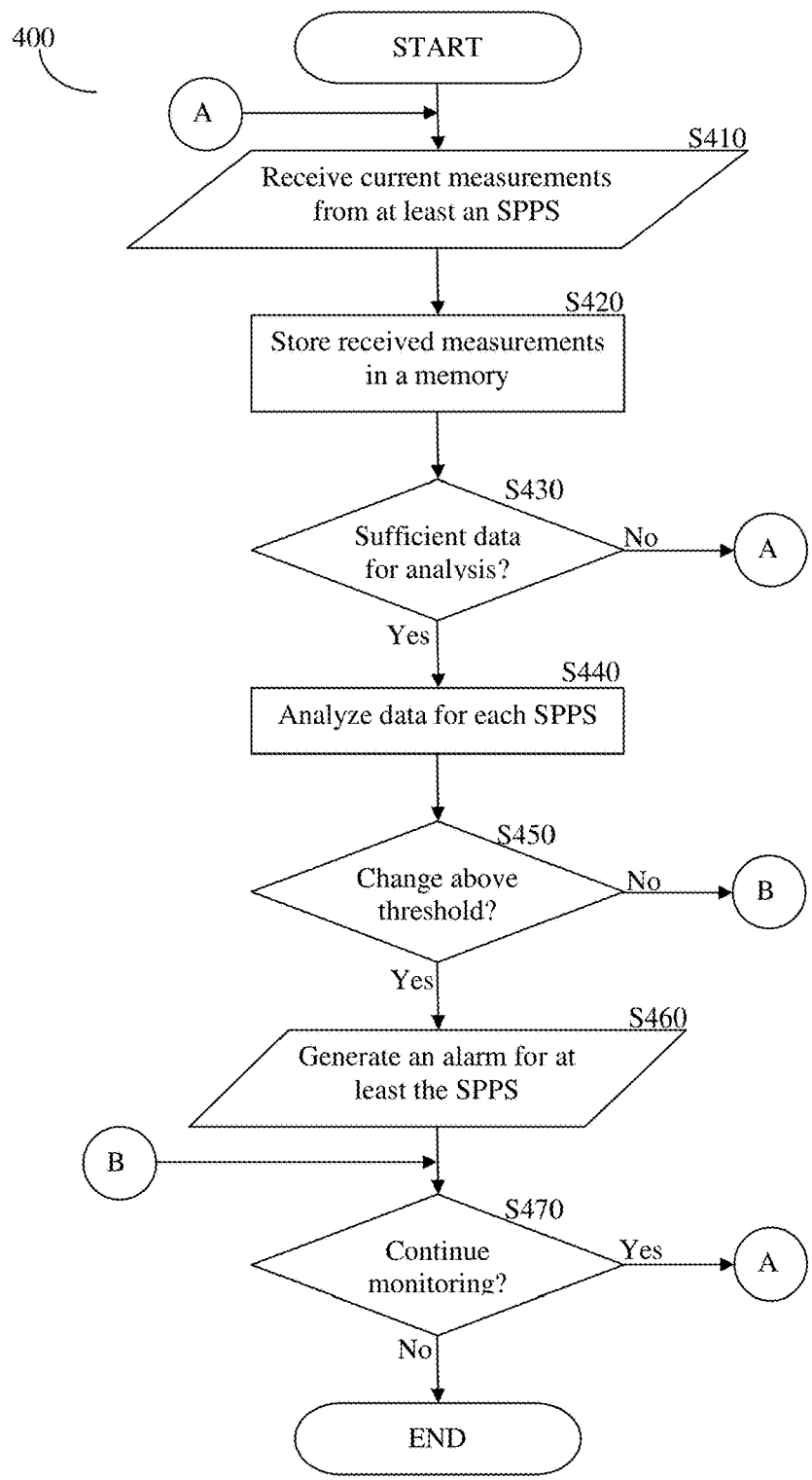
FIG. 4 is a flowchart of the operation of a system for monitoring energy consumption cycles according to an embodiment.

FIG. 4 is an exemplary and non-limiting flowchart 400 of the operation of a system for monitoring energy consumption cycles according to an embodiment. In S410 the server 150 receives through the network 130 measurements of currents from one or more SPPSs 110. Typically measurements are accompanied by additional data, for example, a time stamp for the measurement. In one embodiment, if a time stamp is not included in the received measurement, the server 150 can generate the timestamp using an internal or network based clock. In S420 the data may be stored in the memory of the server 150 or in a storage such as storage 140. In S430 it is checked whether sufficient data for analysis has been collected and if so, execution continues with S440; otherwise, execution continues with S310. In S440 the data collected is analyzed by the server 150 on at least per SPPS basis resulting in determination of the 'on' and 'off' cycles respective of each SPPS which allows determination of the number of short cycles and total number of cycles for the SPPS in respect of a particular energy consuming equipment. In S450 it is checked for each of the SPPSs 110 if there was a change in the ratio between the number of short cycles and the total number of cycles that is beyond a threshold value and if so, execution continues with S460; otherwise, execution continues with S470. It should be noted that the checking of the crossing of a threshold value may also include checking against a database if such a change is part of the normal profile of the system 100 and if so, it would not trigger a determination that the threshold was crossed. In S460 an alarm is generated and sent, for example, to a client node 160. In one embodiment it may be determined that instead of sending an alarm it is necessary to actually stop the operation of the equipment, for example, and without limitation, by communicating back to a building automation system (BAS) (not shown) or to the communication bridge 120 that command a control circuit (not shown) that turns the respective unit off. In one embodiment one or more of the threshold value may be changed responsive to a detection of a potential failure of the equipment. In S470 it is checked whether the operation should continue and if so execution continues with S410; otherwise, execution terminates.

Figure 5:
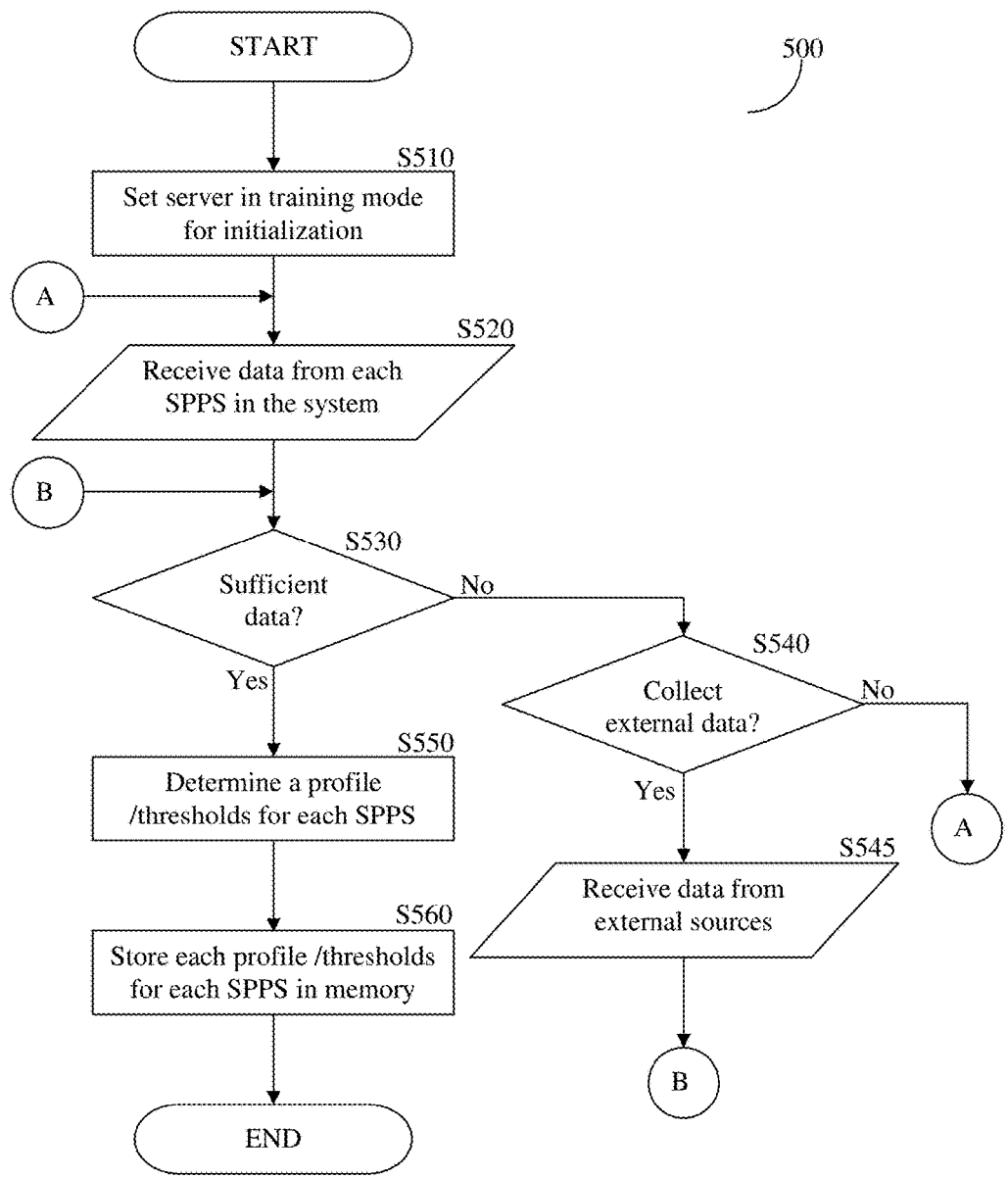
FIG. 5 is a flowchart of the initialization operation of a system for monitoring energy consumption cycles according to an embodiment.

FIG. 5 is an exemplary and non-limiting flowchart 500 of the initialization operation of a system 100 for monitoring energy consumption cycles according to an embodiment. In S510 the server 150 is set into a training mode for initialization of the server 150, in this mode the server 150 does not generate alarms but rather, collects the information received from the SPPSs 110. In S520 data is collected from the SPPSs 110 and is typically stored into the memory of server 150 or in the storage 140. In S530 it is checked whether sufficient information was gathered and if so execution continues with S550, otherwise, execution continues with S540. In S540 it is checked whether to collect information from external sources, as such sources may supply additional data to create a current consumption and cycle profiles for an energy consuming equipment, and if so execution continues with S545; otherwise, execution continues with S520. In S545 data is collected from external resources and added to the data collected by the server 150 from the SPPSs 110, and then execution continues with S530. In S550 a profile respective of current and/or cycles is generated for each energy consuming equipment based on the information collected from its respective SPPS 110 and, when applicable, from external sources. In S560 the profiles are stored in memory or storage 140 for use when the server 150 operates in a normal mode of operation, i.e., configured to generate the alarms discussed, for example, with respect of FIG. 4.

The principles of the invention, wherever applicable, are implemented as hardware, firmware, software or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program embodied in non-transitory computer readable medium, or any combination thereof, which may be executed by a CPU, whether or not such computer or processor is explicitly shown. Implementations may further include full or partial implementation as a cloud-based solution. In some embodiments certain portions of a system may use mobile devices of a variety of kinds. In addition, various other peripheral units may be connected to the computer platform such as an additional data storage unit and a printing unit. The circuits described hereinabove may be implemented in a variety of manufacturing technologies well known in the industry including but not limited to integrated circuits (ICs) and discrete components that are mounted using surface mount technologies (SMT), and other technologies. The scope of the invention should not be viewed as limited by the SPPS 110 described herein and other monitors may be used to collect data from energy consuming sources without departing from the scope of the invention.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A computerized method for generating alarms for an operation of at least an energy consuming equipment, the computerized method comprising:

communicatively connecting to a current consumption monitor coupled to a power line supplying energy to at least the energy consuming equipment;

configuring the current consumption monitor to provide a plurality of time-stamped current measurements indicative of energy consumed by the at least an energy consuming equipment;

receiving periodically the plurality of time-stamped current measurements from the current consumption monitor;

determining a total number of cycles for the current consumption monitor with respect to the at least an energy consuming equipment based on the plurality of time-stamped current measurements, each of the cycles being determined as an on/off sequence of the at least an energy consuming equipment;

determining a number of short cycles for the current consumption monitor in respect of the at least an energy consuming equipment based on the plurality of time-stamped current measurements, each of the short cycles determined as an on/off sequence of the at least an energy consuming equipment, wherein the plurality of time-stamped current measurements indicated the at least an energy consuming equipment was on for a period of time that is shorter than a first threshold;

storing in a memory for each of the at least an energy consuming equipment at least one of: a total number of cycles per a time interval, the total number of short cycles per the time interval, or a ratio between the total number of short cycles per the time interval and the total number of cycles per the time interval; and in a case where the ratio between the total number of short cycles per the time interval and the total number of cycles per the time interval is stored, generating the alarm when the ratio is larger than a second threshold.

2. The computerized method of claim 1, wherein the alarm is one of: an email, a text message, a mobile notification, or a periodic report.

3. The computerized method of claim 1, further comprising:
sending over a network a command to disconnect energy to the power line supplying energy to the at least an energy consuming equipment upon determination that the ratio is larger than a third threshold.

4. The computerized method of claim 3, wherein sending over the network comprises:
sending the command to a building automation system.

5. The computerized method of claim 1, wherein the current compensation monitor is a self-powered power sensor.

6. The computerized method of claim 1, further comprising:
generating the alarm when the total number of short cycles per the time interval exceeds a fourth threshold.

7. The computerized method of claim 1, further comprising:
generating the alarm when the total number of cycles per the time interval exceeds a fifth threshold.

8. The computerized method of claim 1, further comprising:
generating the alarm when the total number of cycles per the time interval is below a sixth threshold.

9. The computerized method of claim 8, wherein the sixth threshold is zero or one.

10. The computerized method of claim 1, wherein at least the first threshold is determined manually from a client node.

11. The computerized method of claim 1, wherein at least the first threshold is determined for data collected from an external resource.

12. The computerized method of claim 1, wherein at least the first threshold is determined for an initialization period where threshold values are determined for the at least an energy consuming equipment.

13. The computerized method of claim 1, wherein generating a total number of cycles further comprises:
setting a current threshold that is above a minimum current and less than a maximum current of the at least an energy consuming equipment when at least an additional energy consuming unit is connected to the power line supplying energy to the at least an energy consuming equipment.

14. The computerized method of claim 1, further comprising:
changing at least a threshold responsive to at least one of: the total number of cycles, the total number of short cycles, or the ratio between the total number of short cycles and the total number of cycles.

15. A system for generating alarms for the operation of at least an energy consuming equipment unit, the system comprising:
a plurality of energy consuming equipment units, each of the energy consuming equipment units connected to a respective power line;
a plurality of current consumption monitors coupled to each of the respective power lines, each current consumption monitor configured to provide a plurality of time-stamped current measurements indicative of energy provided by the power line to which it is coupled;
a network communicatively coupled to the plurality of current consumption monitors for transferring the plurality of time-stamped current measurements;
a server comprising a processing unit, a memory and a network interface, wherein the network interface connects the server to the network interface, and wherein the memory includes instructions therein that when executed by the processing unit configure the server to: receive periodically the plurality of time-stamped current measurements from the plurality of current consumption monitors; determine a total number of cycles for each of the plurality of current consumption monitors in respect of a respective energy consuming equipment unit based on the plurality of time-stamped current measurements, each of the cycles determined as a period of time in which the at least an energy consuming equipment unit consumed energy; determine a number of short cycles for each of the plurality of current consumption monitors in respect of a respective energy consuming equipment unit based on the plurality of time-stamped current measurements, each of the short cycles determined as a period of time in which the at least an energy consuming equipment unit consumed energy that is shorter than a first threshold; and, store in the memory for each of the at least an energy consuming equipment units at least one of: a total number of cycles per a time interval, a total number of short cycles per the time interval, or a ratio between the number of short cycles per the time interval and the total number of cycles per the time interval,
wherein the memory further includes instructions that when executed by the processing unit configure the server to: generate the alarm when the ratio is larger than a second threshold.

16. The system of claim 15, wherein at least a portion of the memory is a database, the database communicatively connected to the network and accessible by the server through the network interface.

17. The system of claim 15, wherein the alarm is one of: an email, a text message, a mobile notification, or a periodic report.

18. The system of claim 15, wherein the memory further includes instructions that when executed by the processing unit configure the server to: send over the network a command to disconnect energy to the power line supplying the at least an energy consuming equipment unit upon determination that the ratio is larger than a third threshold.

19. The system of claim 18, wherein the memory further includes instructions that when executed by the processing unit configure the server to: send the command through the network interface to the network directed to a building automation system communicatively connected to the network.

20. The system of claim 15, wherein each current consumption monitor is a self-powered power sensor.

21. The system of claim 15, wherein the memory further includes instructions that when executed by the processing unit configure the server to: generate the alarm when the total number of short cycles per the time interval exceed a fourth threshold.

22. The system of claim 15, wherein the memory further includes instructions that when executed by the processing unit configure the server to: generate the alarm when the total number of cycles per the time interval exceed a fifth threshold.

23. The system of claim 15, wherein the memory further includes instructions that when executed by the processing unit configure the server to: generate the alarm when the total number of cycles per the time interval is below a sixth threshold.

24. The system of claim 23, wherein the sixth threshold is zero or one.

25. The system of claim 15, wherein the server is configured to receive the at least the first threshold from a client node communicatively connected to the network.

26. The system of claim 15, wherein the server is configured to generate the first threshold for data collected from an external resource communicatively connected to the system.

27. The system of claim 15, wherein the server is configured to generate the first threshold for an initialization period during which threshold values are determined for the at least an energy consuming equipment unit.

28. The system of claim 15, wherein the memory further includes instructions that when executed by the processing unit configure the server that is configured to generate the total number of cycles to: set a current threshold that is above a minimum current and less than a maximum current of the at least a energy consuming equipment unit when at least an additional energy consuming equipment unit from the plurality of energy consuming equipment units is connected to the power line supplying energy to the at least an energy consuming equipment unit.

29. The system of claim 15, wherein the memory further includes instructions that when executed by the processing unit configure the server to: change at least a threshold responsive to at least one of: the total number of cycles, the total number of short cycles, or the ratio between the total number of short cycles and the total number of cycles.

* * * * *